(12) United States Patent
Chandra et al.

(10) Patent No.: US 7,138,873 B2
(45) Date of Patent: Nov. 21, 2006

(54) FILTER CIRCUIT PROVIDING LOW DISTORTION AND ENHANCED FLEXIBILITY TO OBTAIN VARIABLE GAIN AMPLIFICATION

(76) Inventors: Gaurav Chandra, 609, 1st C Main Domlur Layout, Bangalore (IN) 560 071; Prakash Easwaran, #378, Phase-2, Palm Meadows Ramagundanahalli, Bangalore (IN) 560 066; Sumantra Seth, #10, PR Layout Murugeshpalya, Bangalore (IN) 560 017

( * ) Notice: Subject to any disclaimer, the term of this patent is extended or adjusted under 35 U.S.C. 154(b) by 125 days.

(21) Appl. No.: 10/904,578

(22) Filed: Nov. 17, 2004

(65) Prior Publication Data

US 2006/0103469 A1    May 18, 2006

(51) Int. Cl.
    *H03F 3/04* (2006.01)
(52) U.S. Cl. .................. 330/303; 330/278; 330/282
(58) Field of Classification Search ................ 330/303, 330/278, 282, 291
    See application file for complete search history.

(56) References Cited

U.S. PATENT DOCUMENTS 3,701,037 A * 10/1972 Holsinger .................. 330/107
4,745,622 A * 5/1988 Gupta ........................ 375/232
5,481,225 A * 1/1996 Lumsden et al. ............ 330/254
5,880,634 A * 3/1999 Babanezhad ................ 330/126
6,492,876 B1 * 12/2002 Kamal et al. ............... 330/304
6,977,541 B1 * 12/2005 Kurose et al. .............. 327/552

OTHER PUBLICATIONS

Bruce Carter and L.P.Huelsman, "Handbook of Operational Amplifier Active RC Networks—TI Application Report SBOA093A", from Texas Instruments, Inc., Dallas, Texas, www.ti.com, pp. 1-84, Oct. 2001.

* cited by examiner

*Primary Examiner*—Patricia Nguyen (57) ABSTRACT

A low distortion filter circuit implementing variable gain amplification (VGA). An aspect of the present invention increases the degrees of freedom (number of components which can be independently programmed/changed to corresponding desired values) to achieve a desired combination of D.C. gain and filter characteristics (e.g., corner frequency, Q-factor, notch frequency, etc.). Such additional degrees of freedom are attained by including additional components in either on input block or a feedback block (implemented with reference to an operational amplifier), and by redesigning the other block using principles such as admittance cancellation to remove the effects of such additional components. The blocks are designed such that a terminal of the programmable components is connected to a fixed/constant voltage (e.g., ground). Embodiments implementing bi-quad single amplifier with and without notch are disclosed.

18 Claims, 7 Drawing Sheets

FIG. 6

FILTER CIRCUIT PROVIDING LOW DISTORTION AND ENHANCED FLEXIBILITY TO OBTAIN VARIABLE GAIN AMPLIFICATION

BACKGROUND OF THE INVENTION

1. Field of the Invention

The present invention relates to the design of filter circuits in integrated circuits, and more specifically to a method and apparatus to enhance flexibility of a low distortion filter circuit to provide variable gain amplification (VGA).

2. Related Art

A filter circuit generally refers to a circuit which selectively passes frequencies of interest, while inhibiting/blocking other frequencies of an input signal. Filter circuits are also often designed to perform an amplification operation, and provide an amplified output signal containing the frequencies of interest. Such amplification is often required, for example, due to the low strength with which signals are often received and thus to take advantage of full swing possible on an output path, as described below in further detail. Integrating the amplification operation in the filter itself (as compared to using a separate amplification stage) results in lower area power.

The amplification operation to be performed in filer circuits often needs to be designed to provide with variable gain amplification (VGA) as well. VGA generally implies that the amplification factor (output voltage level divided by input voltage level) needs to be different at different instances of time. VGA often enables an input signal (or components containing the frequencies of interest) to be amplified to a desired voltage level, when the input signal strength is changing with time. Such a feature may be used, for example, when the output signal (on an output path) of the filter circuit is sampled by an analog to digital converter (ADC), and it may be desirable to use the entire range of input voltages possible at the input of the ADC irrespective of the strength of the input signal.

The ability to vary the gain/amplification is often attained by having components with programmable values (e.g., ability to set the resistance value for a resistor). The programmability may be achieved by connecting multiple sub-components (typically in series or parallel), and making only some of the sub-components active or operational by the use of appropriate switches. In general, a switch is kept in one of open or closed state to make the corresponding sub-component operational, and in the other state of disconnect (or make non-operational) the sub-component. The active sub-components together form the component with a corresponding value.

It is often desirable that flexibility exist to obtain a desired value for components (each component containing one or more sub-components) being used to perform the filtering and amplification tasks. The flexibility is particularly important because a change of value of one component for one characteristic (for example to attain a desired amplification factor) may alter another characteristic (various attributes of the transfer function, such as corner frequency, Q-factor, notch frequency, etc.. As a result, the magnitudes of a number of components in the circuit would be dependent on each other due to such constraints posed by the filter circuit characteristics. The number of components that can be altered independently, without affecting the transfer characteristics, may be referred to as 'degrees of freedom'.

Filter circuits generally need to be implemented to provide low distortion, in addition to providing VGA and desired transfer function. It is typically desirable that a filter provide a linear response when the amplification factor is set to a constant value, and deviations from such a linear response is referred to as distortion. It is generally desirable to reduce/eliminate distortion since the output signal then would accurately represent the information in the input signals.

What is therefore needed is a filter circuit which provides enhanced flexibility such that a desired transfer function, desired amplification factor, and low distortion can be obtained.

BRIEF DESCRIPTION OF THE DRAWINGS

The present invention will be described with reference to the following accompanying drawings.

FIG. (FIG.) 1A is a circuit diagram depicting a topology of a single amplifier bi-quadratic filter circuit in one prior embodiment.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

Overview

An aspect of the present invention provides a filter circuit with variable gain amplification (VGA) by including additional passive components in one of input path (which provides input signal to an operational amplifier) and feedback path, and by redesigning the other path to cancel the effect of such additional passive components. Such cancellation can be achieved by using principles such as admittance concellation well known in the relevant arts.

By including the additional components, the degrees of freedom to obtain desired (attributes of) transfer function and desired amplification factor, can be increased.

The additional components and the re-design of the path can be chosen such that the components that have programmable values, are connected to a constant voltage (e.g. ground) at one end. Switches providing the programmability can then be connected to the constant voltage. If switches were not connected to a constant voltage but to a signal dependent voltage, the resistance of the switches changes as a function of signal strength, causing non-linear response. Connecting the switches to constant voltage ensures that the switches provide a constant impedance, which in turn results in a linear response of the circuit providing variable gain amplification, irrespective of the gain to which the filter is programmed.

The principles noted above can be used to provide various filter circuits. In one embodiment described below, a second order filter based on a single amplifier is provided with low distortion and variable gain amplification capability, while providing several degrees of freedom. In another embodiment, a similar filter, but generating a notch also in the transfer function, is provided.

The features of such filter circuits can be appreciated by comparison with example prior circuits which do not use one or more of the features of the present invention. Accordingly, such example prior filter circuits are described below first with reference to FIGS. 1A, 1B, and 2.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

Prior Single Amplifier Bi-Quadratic Filter Circuit

Figure 1A:
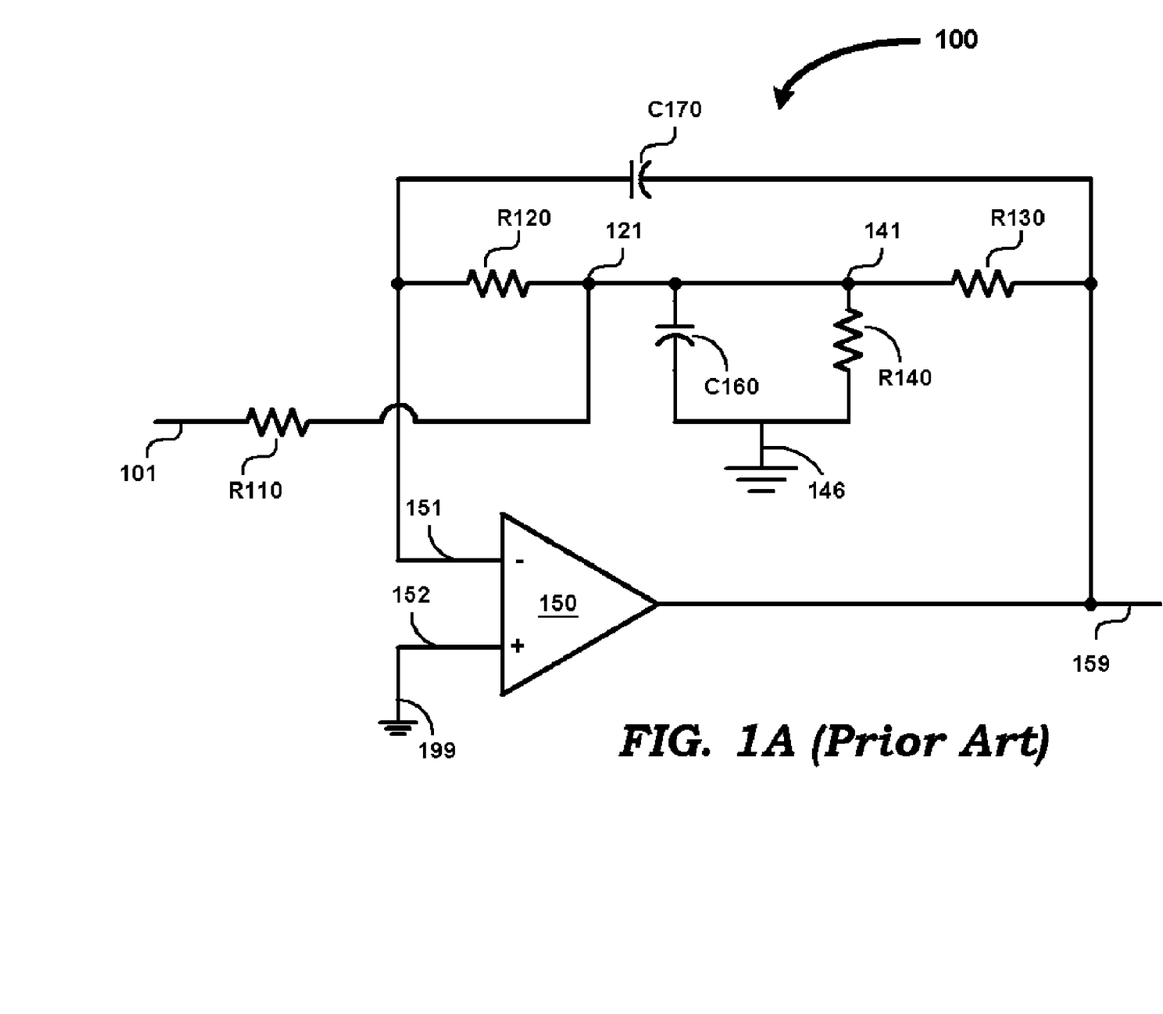

FIG. 1A is a circuit diagram illustrating the details of a single amplifier bi_quadratic filter circuit in one prior embodiment. Filter Circuit 100 is shown containing resistors R110, R120, R130 and R140, operational amplifier (op-amp) 150, and capacitors C160 and C170. Each component is described below.

Operational amplifier 150 receives the signal on path 151 at inverting input terminal through the path containing resistors R110 and R120. The non_inverting input terminal 152 is connected to ground to provide single ended operation. Operational amplifier 150 amplifies the signal at inverting terminal 151 and provides the amplified signal on output path 159.

Resistors R110, R120, R130 and R140, and capacitors C160 and C170 together form a second order (bi-quadratic) low pass filter circuit to allow only the frequency band of interest and reject all other frequency components in the input signal received on path 101. Thus, filter circuit 100 may reject the unwanted interference signals in signal 101 and provides the amplified filtered signal on path 159.

Assuming that the resistance of resistors R110, R120, R130 and R140 equal R4, R2, R3 and R1 respectively, and capacitances, of capacitors C160 and C170 equal C1 and C2 respectively, the transfer function (H(s)) of filter circuit 100 is given by equation (1) below, wherein '*', '/' and '+' respectively represent multiplication, division, and addition arithmetic operations, and 's' represents jT in Laplace Domain.

$$H(s) = \frac{R_3}{R_4} \cdot \frac{1}{1 + sC_2 \cdot \left(R_3 + R_2 + \frac{R_3 R_2}{R_1} + \frac{R_3 R_2}{R_4}\right) + s^2 \cdot C_1 C_2 R_3 R_2}$$

Equation (1)

The characteristics (e.g., gain, corner frequency, Q (quality)-factor) of filter circuit 100 are determined by appropriate selection of the values of circuit components (R110, R120, R130, R140, C160 and C170). It may be observed from Equation (1) that D.C. gain of filter circuit 100 depends on the ratio R3/R4. By having R3 and R4 programmable, VGA capability can be provided to filter circuit 100. However, prior filter circuit 100 may have one or more problems/drawbacks as described briefly below.

3. Example Problem(s) with Prior Filter Circuit 100 to include VGA

As noted above, the VGA features can be achieved by making components R130 and R110 programmable. Each resistor can be made programmable as illustrated with reference to FIG. 1B. R130 is shown containing multiple sub-resistors (sub-components) R171, R172, R173 and R174 in series, and switches 181, 182, and 183 connected in parallel to resistors R172, R173, and R174. For illustration, only four resistors are shown connected in series, however, more/fewer resistors and correspondingly more/fewer switches can be connected for a corresponding level of programmability. Each of switches 181–183 may be turned on/off based on the desired resistance for R130, as determined by the desired gain value.

Figure 1B:
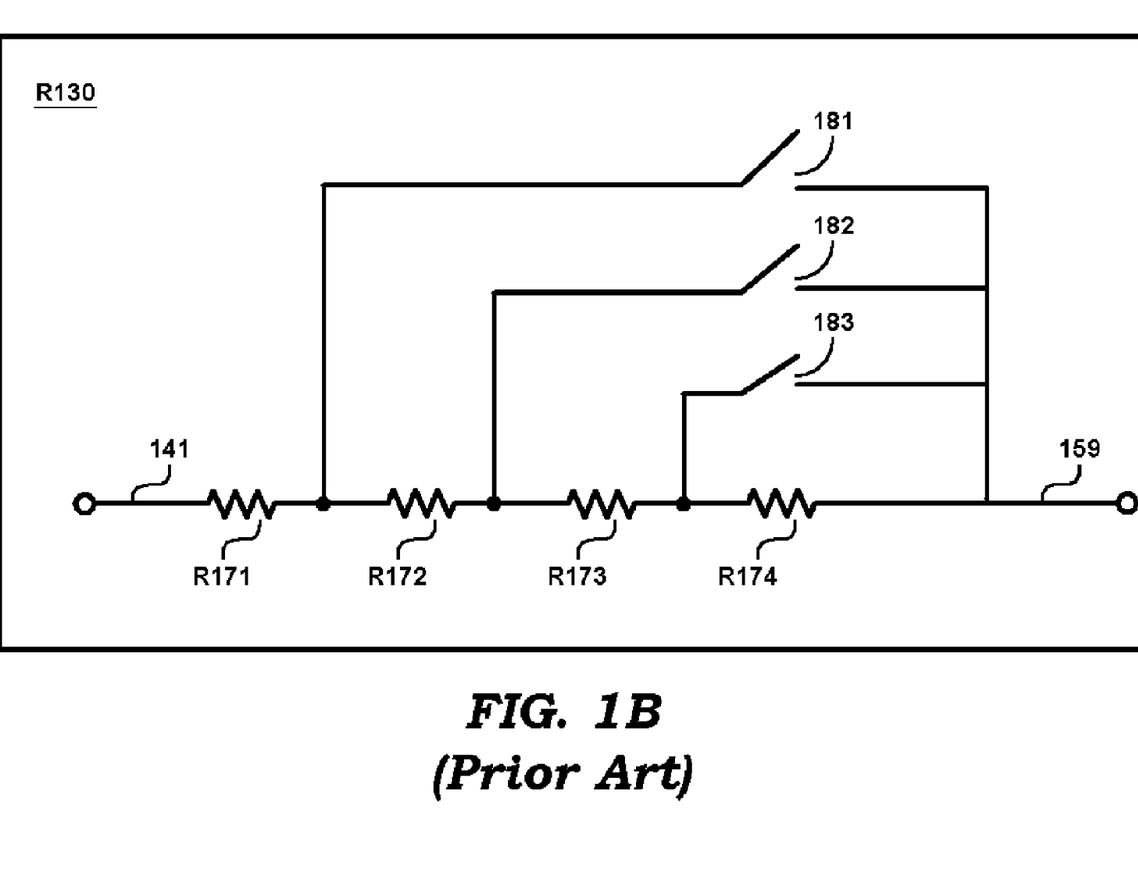
FIG. 1B is a diagram illustrating the manner in which a component be designed to be programmable in one prior embodiment.

It may be observed that both the terminals of resistor R130 are present in signal path (between paths 141 and 159 of FIG. 1A), i.e., a path of components through which a signal would propagate from input to output of a circuit. The switches, as shown in FIG. 1B, can be connected to either node 141 or node 159. But in both the cases, a change in the signal level on path 159/141 would cause the resistance/impedance of switches 181–183 also to be change/modulated at least in cases when the switches are implemented using transistors since the impedance offered by a transistor varies according to the cross terminal voltage. Thus, resistor 130 (and R110, as well for similar reasons) may offer different impedance values depending on the input signal level. As a consequence, filter 100 may provide a non-linear response.

From the above, it may be appreciated that having the programmable components (as in the case of FIG. 1) in a signal path could cause distortion in the signal characteristics. Since the gain of the filter circuit depends only on the ratio of resistances of resistors R130 and R110, filter circuit 100 is unsuitable for VGA due to the presence of R130 and R110 in the signal path.

The description is continued with reference to another prior filter circuit, which also provides a notch in the transfer function. As is well known, notch generally refers to a pair of conjugate purely imaginary zeros, which enables the transfer function to go to zero at a finite frequency of the input signal. By having a notch, one achieves a sharper roll-off (and thus better filtering).

4. Prior Single Amplifier Bi-quadratic Filter Circuit Generating a Notch

Figure 2:
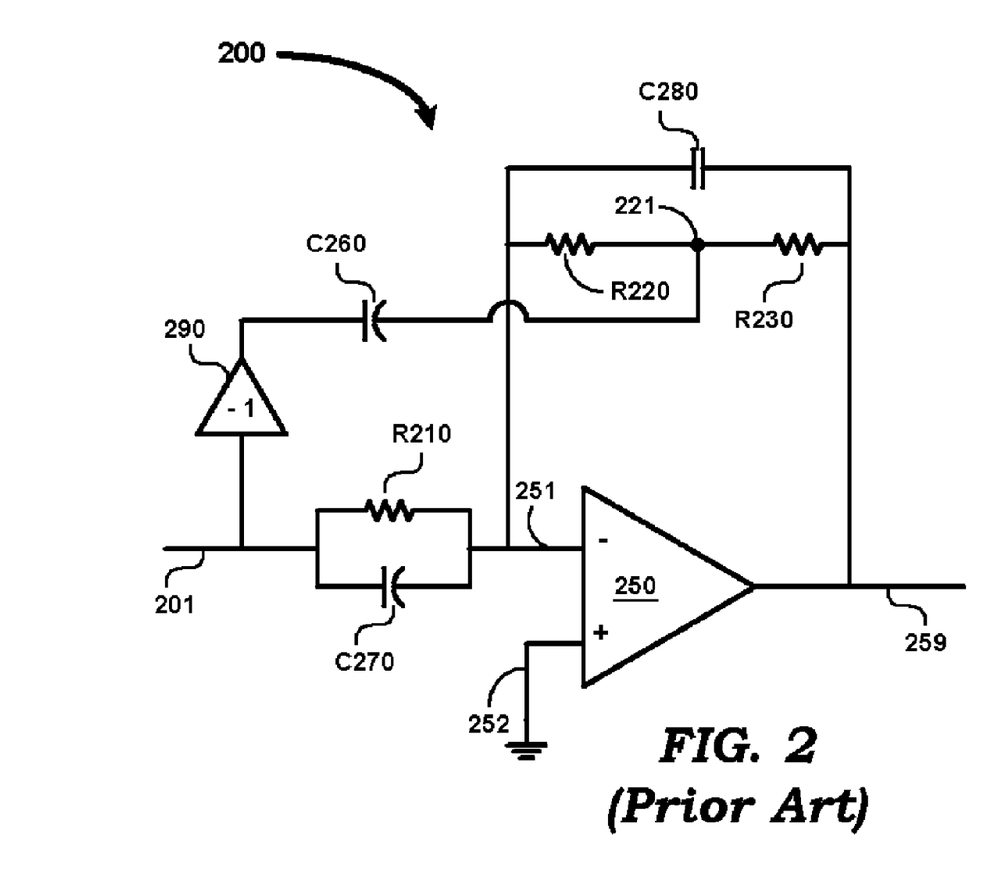
FIG. 2 is a circuit diagram depicting a topology of a single amplifier bi-quadratic filter circuit generating a notch in another prior embodiment.

FIG. 2 is a circuit diagram illustrating the details of a single amplifier bi_quadratic filter circuit in one prior embodiment. Filter circuit 200 is shown containing resistors R210, R220 and R230, operational amplifier 250, capacitors C260, C270 and C280, and inversion block 290. Each component is described below.

Operational amplifier 250 receives the signal on path 251 at inverting input terminal through the path containing resistor R210 and capacitor C270. The non_inverting input terminal 252 is connected to ground to provide single ended operation. Operational amplifier 250 amplifies the signal at inverting terminal 251 and provides the amplified signal on output path 259.

Resistors R210, R220, and R230, capacitors C260, C270, and C280, and inversion block 290 together form a second order (bi-quadratic) low pass filter circuit to allow only the frequency band of interest and reject all other frequency components in the signal received on path 101. Inversion block 290 provides an inverted signal of the signal received on path 201 as an input to capacitor C260. This inversion can be obtained, for instance, in a fully differential circuit by flipping the polarity of the input wires before connecting to capacitor 260.

In addition, the parallel combination of resistor R210 and capacitor C270, along with capacitor 260, provides a notch (which allows rejection of unwanted frequency component in the desired band of frequencies) in the filter characteristics. Thus, filter circuit 100 may reject the unwanted interference signals in signal 101 and provides the amplified filtered signal on path 159.

Assuming that the resistance of resistors R210, R220, and R230 equal R3, R1, and R2 respectively, and capacitances of capacitors C260, C270, and C280 equal C1, C3 and C2 respectively, the transfer function (H(s)) of filter circuit 200 is given by equation (2) below.

$$H(s) = \frac{R_1 + R_2}{R_3} \cdot \frac{1 + S^2 \cdot C_1 C_3 R_3 (R_1 \| R_2)}{1 + sC_2 \cdot (R_1 + R_2) + s^2 \cdot C_1 C_2 R_1 R_2} \qquad \text{Equation (2)}$$

wherein '+', 'X', and '/' represent addition, multiplication, division operators respectively, and symbol '∥' represents the effective resistance when the corresponding two resistors are connected in parallel.

In addition, filter circuit 200 generates a notch if the condition of Equation (3) below is satisfied, as is well known in the relevant arts.

$$R_3 C_3 (R_1 + R_2) + R_1 R_2 C_1 = R_2 R_3 C_1 \qquad \text{... Equation (3)}$$

It may be observed from Equation (2) that gain of circuit 200 depends on resistors R210, R220 and R230, and from Equation (3) that condition for generating a notch depends on values of five components R210, R220, R230, C260 and C270. Some of the problems with prior filter circuit 200 are described below.

5. Example Problem(s) with Prior Filter Circuit 200 to include VGA

It may be observed from FIG. 2 that components C260 and R230 are contained in signal path and a terminal of each of the remaining four components R210, R220, C270, and C280 (other than C260 and R230) is connected to virtual ground 251 of op-amp 250. Thus, the values of R210, R220, C270, and C280 can be changed without introducing distortion in signals.

As noted above with respect to Equation (2), the gain of circuit 200 depends on resistors R210, R220 and R230. Gain of filter circuit 200 can be varied by changing the values of R210 and R220, without introducing distortion. However, a change in the values of R210 and R220 would impact other characteristics of filter circuit 200, which include five parameters corner frequency, Q-factor, gain, notch frequency, and condition for admittance concellation.

Thus, to preserve five characteristics of filter circuit 200, five other component values may need to be varied. However, only four components R210, R220, C270, and C280 can be varied without causing distortion, and changing the values of other two components R230 and C260 may cause unacceptable levels of distortion for reasons noted above.

Therefore, it may be noted that filter circuit 100 of FIG. 1A is limited in providing VGA capability without distortion, while filter circuit 200 of FIG. 2 can provide VGA, but lacks sufficient degrees of freedom to change the number of component values required to preserve other characteristics, without introducing distortion. Thus, each of prior filter circuits 100 and 200 may not be suitable at east in some scenarios.

The description is continued with reference to a block diagram describing the principle of various aspects of the present invention.

6. Admittance Cancellation Technique

Figure 3:
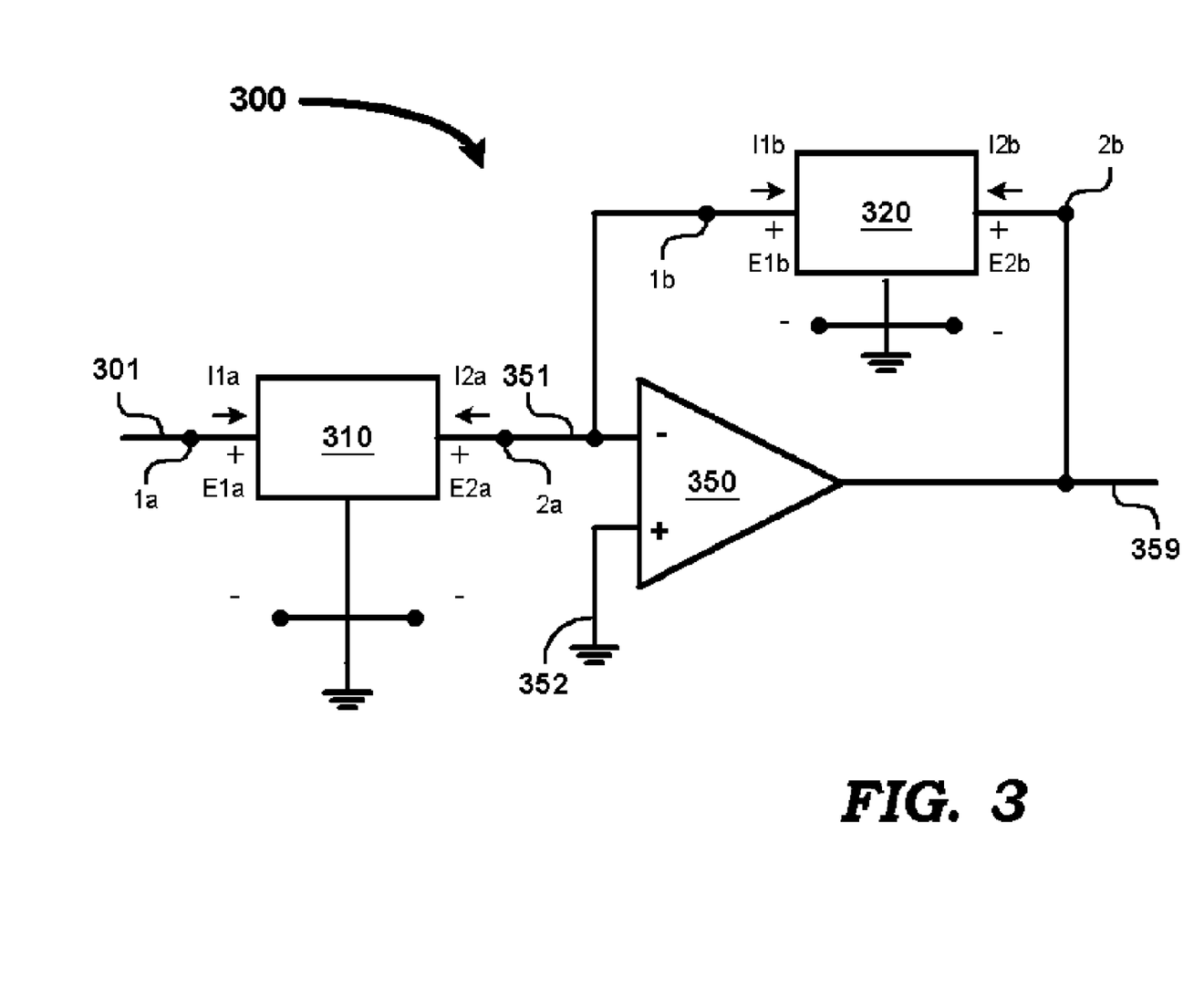
FIG. 3 is a block diagram illustrating the principle which can be used to design a general topology of a filter circuit providing variable gain amplification (VGA) according to an aspect of the present invention.

FIG. 3 is a block diagram of filter circuit 300 illustrating the principle of an aspect of the present invention. Block diagram 300 is shown containing input block 310, feedback block 320 and operational amplifier (op-amp) 350. Each component is described below.

According to an aspect of the present invention, at least one of input block 310 and feedback block 320 is designed to include additional/more components than required to implement the desired filter characteristics. The other block is then designed to neutralize/cancel the effect of such additional components. Such neutralization may be implemented using admittance cancellation techniques and the principle of such a design is described below.

Each of input block 310 and feedback block 320 may be implemented as a two port network using passive components. Part 1a and ground are the two input ports, and port 2a and ground are the two output ports of input block 310. Similarly, port 1b and ground are the two input ports, and port 2b and ground are the two output parts of feedback block 320. Corresponding Y-parameter equations are given by equations (4), (5), (6) and (7) below.

$$I_{1a} = y_{11a} E_{1a} + y_{12a} E_{2a} \qquad \text{... Equation (4)}$$

$$I_{2a} = y_{12a} E_{1a} = y_{22a} E_{2a} \qquad \text{... Equation (5)}$$

$$I_{1b} = y_{11b} E_{1b} + y_{12b} E_{2b} \qquad \text{... Equation (6)}$$

$$I_{2b} = y_{12b} E_{1b} + y_{22b} E_{2b} \qquad \text{... Equation (7)}$$

wherein I1a and I2a are the respective currents flowing into two ports 1a and 2a of input block 310, E1a and E2a are the respective voltages at ports 1a and 2a of input block 310, y11a, y22a and y12a/y21a are respectively the input admittance, output admittance, and transfer admittances of input block 310, I1b and I2b are the respective currents flowing into two ports 1b and 2b of feedback block 320, E1b and E2b are the respective voltages at ports 1b and 2b of feedback block 320, and y11b, y22b and y12b/y21b are respectively the input admittance, output admittance and transfer admittance of feedback block 320.

Also, as is well known in the relevant arts, for a passive network, the transfer admittance from port 1a/1b to port 2a/2b equals the transfer admittance from 2a/2b to port 1a/1b of input block 310/feedback block 320. That is, y12a=y12a and y21b=y12b.

For the circuit of FIG. 3, each of voltages E2a and E1b equals zero and current I2a equal I1b since negligible amount of current flows to operational amplifier 350 due to virtual ground 351. Thus, the transfer function of filter circuit 300 is obtained by simplifying equations (5) and (6), and is given by equation (8) below.

$$\frac{E_2}{E_1} = -\frac{y_{12a}}{y_{12b}} \qquad \text{Equation (8)}$$

In general, any filter circuit requires complex poles or complex zero for a reliable filtering operation. However, a two port passive network contains red poles, which causes red zeros in the transfer function of Equation (8) and thus need to be removed for filtering operation. Thus, the poles of y12a have to be matched to the poles of y12b to cancel red poles in the two admittances and thus avoiding red zeros in the transfer function. The condition of equaling the poles of y12a to the poles of y12b is the admittance concellation condition, which is given by equation (9) below.

$$\text{Poles of } y12a = \text{Poles of } y12b \qquad \ldots \text{Equation (9)}$$

As a result of equation (9), equation (8) contains only zeros in the two admittances and thus the zeros of y12b are the poles of the closed loop transfer function, and the zeros of y12a are the zeros of the transfer function, which can be used to implement a notch.

Thus, equation (8) can be used to implement a required filter transfer function, and equation (9) can be used to provide degrees of freedom by cancelling the effect of additional components.

Due to the presence of the additional components, additional degrees of freedom may be presented to attain various desired filtering/amplification related characteristics. The additional components may also be designed such that one terminal is connected to ground. As a result, the transistors (operating as switches allowing programmability) may be designed to offer a constant impedance, thereby avoiding undesirable distortion.

7. An Inventive Aspect: Single Amplifier Bi-Quad Filter Circuit

Figure 4:
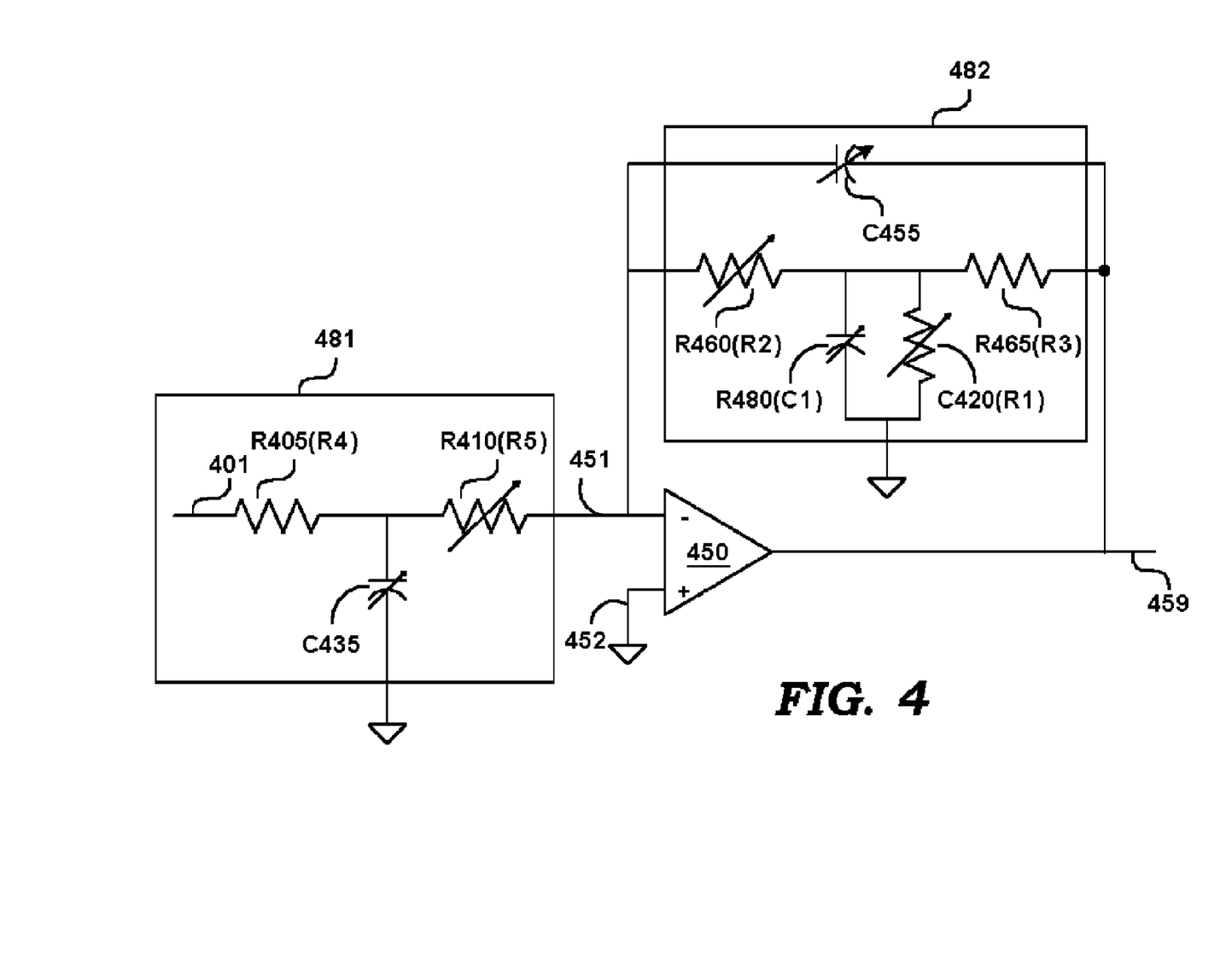
FIG. 4 is a circuit diagram depicting the topology of a single amplifier bi-quadratic filter circuit providing VGA in an embodiment of the present invention.

FIG. 4 is circuit diagram illustrating the details of a single amplifier bi_quadratic filter circuit in an embodiment of the present invention. Filter circuit 400 is shown containing resistors R405, R410, R460, R465 and R480, operational amplifier 450, and capacitors C420, C435 and C455. As described below, the components of blocks 481 and 482 respectively correspond to blocks 310 and 320 of FIG. 3.

Operational amplifier 450 receives the signal on path 451 through input block 481. The non_inverting input terminal 452 is connected to ground to provide a single ended operation. Operational amplifier 450 amplifies the signal at inverting terminal 451 and provides the amplified signal on output path 459.

Feedback block 482 contains resistors R460 and R465, and capacitors C420 and C455, which respectively correspond to resistors R120 and R130, and capacitors C160 and C170 of FIG. 1. Feedback block 482 also contains resistor R480 which is not essential, but facilitates attaining the desired transfer function by providing additional freedom. It may be appreciated the one terminal of each of R480 and C420 is connected to ground, facilitating avoidance of distortion.

Input block 481 contains resistor R405, resistor R410 and capacitor C435—which are used for admittance cancellation, as noted above. The transfer function of filter circuit 400 is given by the following Equation:

$$\frac{V_o}{V_{in}} = \frac{G}{1 + sC_2\left(R_2 + R_3 + \frac{R_2R_3}{R_1}\right) + s^2 C_1 C_2 R_2 R_3} \qquad \text{Equation (10)}$$

Wherein G (DC gain) is given by the following equation:

$$G = \frac{R_2 + R_3 + \frac{R_2 R_3}{R_1}}{R_4 + R_5} \qquad \text{Equation (11)}$$

As noted above, for admittance cancellation, the poles of transfer admittance of input block 481 has to equal the poles of transfer admittance of feedback block 482 Block 481 and 482 each have one red pole as given by Equations (12) and (13) respectively below.

$$\text{Admittance pole of block } 481 = \frac{1}{C_4}\left(\frac{1}{R_4} + \frac{1}{R_5}\right) \qquad \text{Equation (12)}$$

$$\text{Admittance pole of block } 482 = \frac{1}{C_1}\left(\frac{1}{R_1} + \frac{1}{R_2} + \frac{1}{R_3}\right) \qquad \text{Equation (13)}$$

Thus, the condition of admittance cancellation by equating equations (12) and (13) according to equation (9) is given by the below equation:

$$(R_1 \| R_2 \| R_3) C_1 = (R_4 \| R_5) C_4 \qquad \ldots \text{Equation (14)}$$

Once the components of FIG. 4 are designed to satisfy the criteria of above Equation, filter circuit 400 provides the desired second order transfer function.

Filter circuit 400 contains six components (R410, R460, R480, C435, C455, C420), which can be programmed (as shown by the variable sign, arrow on each of these components) to attain desired filter characteristics. The filter characteristics to be programmed are corner frequency, Q-factor and DC gain (For VGA). In addition, the condition of equation (12) above, for admittance cancellation, needs to be satisfied. Thus there are a total of four constraints and six components that can be programmed, resulting in two degrees of freedom for the circuit.

In operation, components in input block 481 control the admittance cancellation condition and the components in feedback block 482 control the corner frequency and Q-factor. For equation (13) above, the transfer admittance of feedback block 482 has a pole at the frequency wx=1/((R1∥R2∥R3)*C1), wherein ∥represents the effective resistance when resistors are connected in parallel, and * represents a multiplication operation. But noting from equation (14), the corner frequency and Q-factor are given by $$\frac{1}{\omega_0^2} = C_1 C_2 R_2 R_3 \qquad \text{Equation (15)}$$

$$\frac{1}{\omega_0 Q} = C_2 \left(R_2 + R_3 + \frac{R_2 R_3}{R_1}\right) \qquad \text{Equation (16)}$$

Dividing equation (16) by equation (15), one obtains $$\frac{\omega_0}{Q} = \frac{1}{C_1}\left(\frac{1}{R_1} + \frac{1}{R_2} + \frac{1}{R_3}\right) \quad \text{Equation (17)}$$

This is the same as the expression for admittance pole of block 482 from (13). Thus, the unwanted red pole always comes at a frequency w/Q regardless of component values. As a result, R460, R480, C420 and C455 can be varied to control the transfer function and the gain of filter circuit 400, without changing the components in input block 481 once the corner frequency and Q-factor are fixed. However, the degrees of freedom provided by the components in input block 481 can also be advantageously used, as necessary in specific situations.

Figure 5:
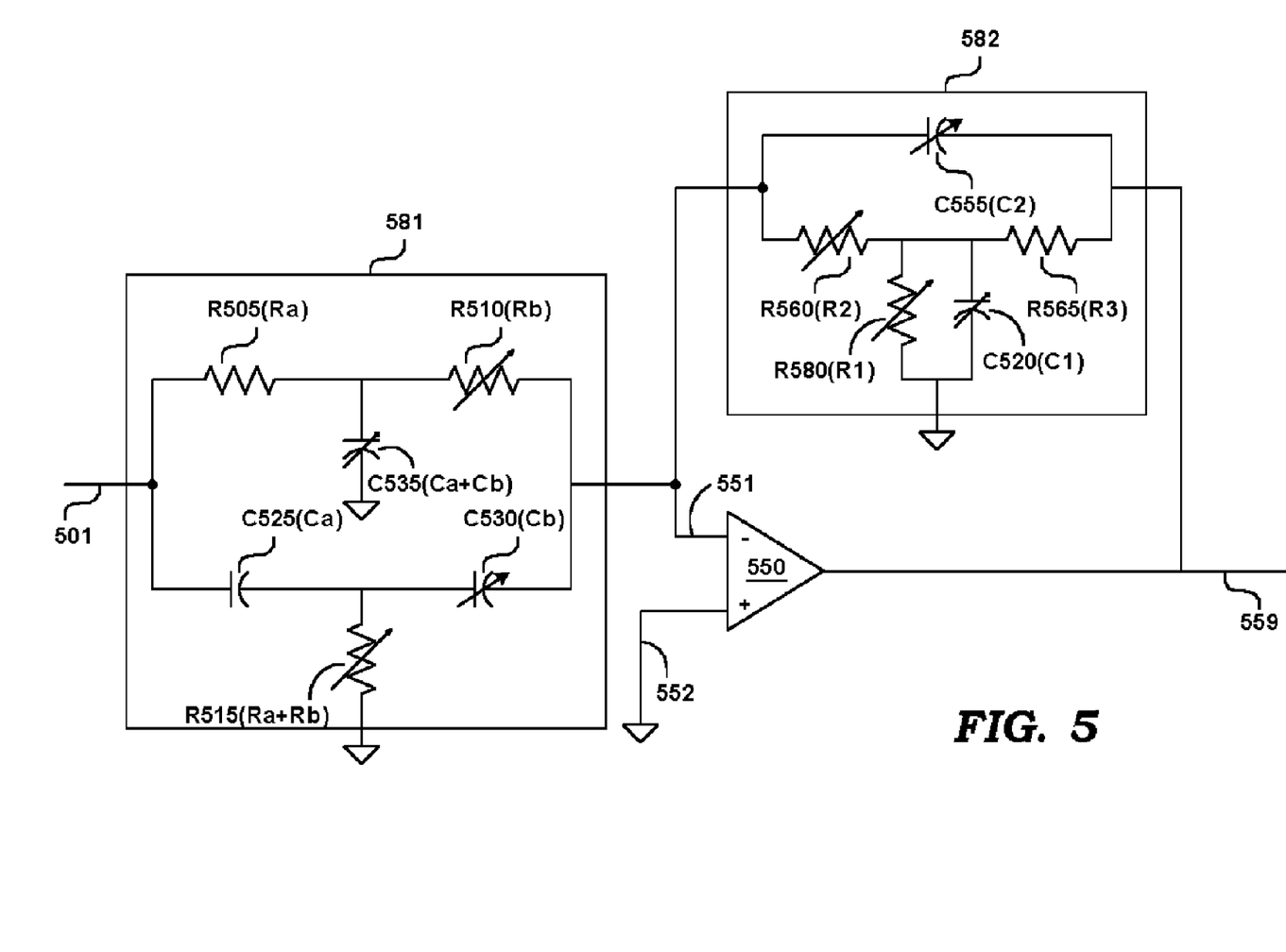
FIG. 5 is a circuit diagram depicting the topology of a single amplifier bi-quadratic filter circuit with notch providing VGA in an embodiment of the present invention.

It should be understood that the topology shown in FIG. 4 can be adapted to implement various second order filters. However, one class of circuits that is not covered by the approach(es) of FIG. 4 is bi-quadratic filters that have a notch (a pair of complex conjugate transmission zeros). Such bi-quadratic filters are often used for filters such as Elleptical filters and Inverse Chebyshev filters, as is well known to one skilled in relevant arts. FIG. 5 illustrates how additional degrees of freedom can be attained for such class of filter circuits while avoiding/minimizing introduction of noise due to switches, in designing second order single amplifier filter circuit with notch.

8. Another Inventive Aspect: Single Amplifier Bi_Quad Filter Circuit With Notch FIG. 5 is circuit diagram illustrating the details of a single amplifier bi_quadratic filter circuit in on embodiment of the present invention. Filter circuit 500 is shown containing resistors R505, R510, R515, R560, R565 and R580, operational amplifier 550, and capacitors C520, C525, C530, C535 and C555. The components of blocks 581 and 582 respectively correspond to blocks 310 and 320 of FIG. 3.

For conciseness, only the differences of FIG. 5 compared to FIG. 4, are described. Resistors R505, R510, R560, R565 and R580, operational amplifier 550, and capacitors C520, C535 and C555 respectively correspond to resistors R405, R410, R460, R465 and R480, operational amplifier 450, and capacitors C420, C435 and C455 of FIG. 4.

Input block 581 contains resistors R505, R510 and R515, and capacitors C525, C530 and C535, which provide additional degrees of freedom to vary the gain as well as achieve the desired filter characteristics.

In one embodiment, the value of capacitor 535 equals a constant ($) times the sum of the values of capacitors C520 and C530, and the value of resistor 515 equals $ times effective resistance of parallel combination of resistors R505 and R510 (represented as R505 ∥R510).

The transfer function of filter circuit 500 is given by the following Equation:

$$\frac{V_o}{V_{in}} = G \cdot \frac{(1 + s^2 C_a C_b R_a R_b \beta)}{1 + sC_2\left(R_2 + R_3 + \frac{R_2 R_3}{R_1}\right) + s^2 C_1 C_2 R_2 R_3} \quad \text{Equation (18)}$$

wherein G is given by the following equation:

$$G = \frac{R_2 + R_3 + \frac{R_2 R_3}{R_1}}{R_a + R_b} \quad \text{Equation (19)}$$

As noted above, for admittance cancellation, the poles of transfer admittance of input block 581 has to equal the poles of transfer admittance of feedback block 582. Each of blocks 581 and 582 has one red pole, as given by Equations (20) and (21) below.

$$\text{Admittance pole of block 581} = \left(\frac{1}{R_a} + \frac{1}{R_b}\right)\frac{1}{\beta(C_a + C_b)} \quad \text{Equation (20)}$$

$$\text{Admittance pole of block 582} = \frac{1}{C_1}\left(\frac{1}{R_1} + \frac{1}{R_2} + \frac{1}{R_3}\right) \quad \text{Equation (21)}$$

Thus, the condition of admittance cancellation by equating equations (20) and (21) according to equation (9) is given by the below equation:

$$(R_1 \| R_2 \| R_3)C_1 = \beta(R_a \| R_b)(C_a + C_b) \quad \ldots \text{Equation (22)}$$

Once the components of FIG. 5 are designed to satisfy the criteria of above Equation, filter circuit 500 provides the desired second order transfer function.

Filter circuit 500 contains eight components (R510, R515, R516, R518, C530, C535, C555, C520), which can be programmed to attain desired filter characteristics. The filter characteristics to be programmed are corner frequency, Q-factor, notch frequency, and DC gain (For VGA). In addition, the condition of equation (19) above, for admittance cancellation, needs to be satisfied. Thus there are a total of five constraints and eight components that can be programmed, resulting in three degrees of freedom for the circuit.

In operation, components in input block 581 control the notch frequency and the admittance concellation condition, and components in feedback block 582 control the corner frequency and Q_factor. As with filter circuit 400, it can be shown that unwanted zero lies at T/Q (T representing corner frequency and Q representing quality factor). As a result, R560, R580, C520 and C555 can be varied to control the transfer function and the gain of filter circuit 500, without changing the components in input block 581 once the notch frequency, corner frequency and the Q-factor are fixed. However, the degrees of freedom provided by the components in input block 581 can also be advantageously used, as necessary in specific situations.

While the embodiments of above are described with respect to single ended implementation merely for illustration, it should be understood that extension of the approaches to differential operation will be apparent to one skilled in the relevant arts by reading the disclosure provided herein. The corresponding embodiments are also contemplated to be covered by various aspects of the present invention.

In addition, the second order filter of above can be used to implement higher order filters by using the second order filter in one or more stages of the higher order filter.

An example system, which may implement various aspects of the present invention is described below with reference to FIG. 6.

9. Example System

Figure 6:
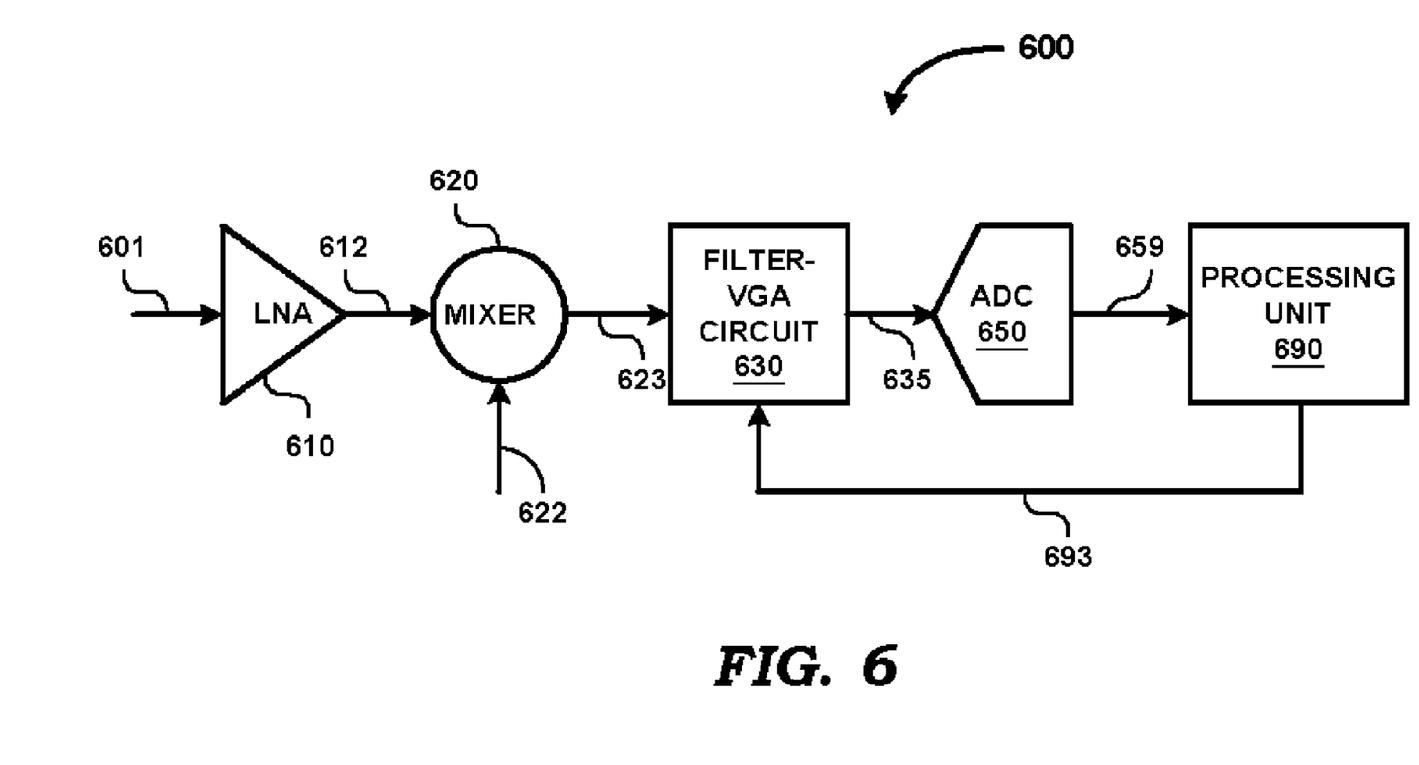
FIG. 6 is a block diagram illustrating an example system implemented according to an aspect of the present invention.

FIG. 6 is a block diagram illustrating an example system implemented according to an aspect of the present invention. For illustration, it is assumed that receiver system 600 is implemented within a Wireless Local Area Network (WLAN) Receiver. However, receiver system 600 can be implemented in other devices (wireless as well as wire-based communications) as well.

Receiver system 600 is shown containing low noise amplifiers (LNA) 610, mixer 620, filter circuit with VGA 660, analog to digital converter (ADC) 650, and processing unit 690. Each block/stage is described in further detail below.

LNA 610 receives signals on path 601 and amplifies the received signals to generate a corresponding amplified signal on path 612. For example, in wireless systems, the signals that are transmitted from satellites, etc. may be received by an antenna (not shown) and the received signals are provided on path 601. The received signals may be weak in strength and thus amplified by LNA 610 for further processing.

Mixer 620 may be used to down-convert the received amplified signal on path 612 into an intermediate signal with the frequency band of interest centered at a lower frequency than the carrier frequency of the received signal. In an embodiment, a signal with the frequency band of interest centered at 2.4 GHz (carrier frequency) is converted to a signal with the frequency band of interest centered at zero frequency.

Mixer 620 may receive the amplified signal on path 612 and a signal of fixed frequency on path 622 as inputs, and provides the intermediate signal on path 623. The signal on path 622 of fixed frequency may be generated by a phase locked loop (not shown) in a known way. LNA 610 and mixer 620 may be implemented in a known way. In general, LNA 610 on mixer 620 together represent a pre-processing circuit before the signal is processed by filter circuit 630. Different types of pre-processing may be performed depending on the specific environment, as will be apparent to one skilled in the relevant arts by reading the disclosure provided herein.

Filter circuit 630 may be implemented with a variable gain amplification (VGA) according to various aspects of the present invention as described above. Filter circuit with VGA 630 may be implemented similar to FIGS. 4 and 5. Filter circuit 630 receives signal on path 693 representing the desired amplification, and accordingly gain is adjusted as described above.

Filter circuit 630 with VGA may correspond to a low pass filter which allows the desired low frequencies and rejects all other unwanted high frequencies present in the signal received on line 623. The filtered signal, which contains the frequency band of interest, is provided on path 635. ADC 650 converts (samples) the filtered signal received on path 635 to a corresponding digital value on path 659, which represents the signal of interest in received signal 601.

Processing unit 690 receives digital values representing the signal of interest in received signal 601 on path 659 and measures/estimates the strength of the received signal. Processing unit 690 generates signal on path 693 representing the amount of amplification required based on the measurement. As noted above, filter circuit 630 adjusts the gain according to the signal received on path 693.

10. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A filter circuit processing an input signal to provide a variable gain amplification (VGA), said filter circuit comprising:
   an operational amplifier having an input terminal and an output terminal;
   a first resistor and a second resistor connected in series at a first node, a second terminal of said second resistor being connected to said input terminal of said operational amplifier, said first resistor being coupled to receive said input signal at an input node;
   a first capacitor connected between said first node and a first constant bias;
   a second capacitor connected between said input terminal and said output terminal;
   a third resistor and a fourth resistor connected in series between said input terminal and said output terminal, said third resistor and said fourth resistor being connected at a second node; and
   a third capacitor connected between said second node and a second constant bias,
   wherein at least some of said first resistor, said second resistor, said third resistor, said fourth resistor, said second capacitor, said first capacitor, and said third capacitor are programmable to corresponding desired values to achieve said desired VGA,
   and wherein said input signal amplified by said VGA is provided as an amplified signal to said output terminal.

2. The invention of claim 1, wherein at least three of said second resistor, said third resistor, said second capacitor, said first capacitor, and said third capacitor are programmable to corresponding desired values.

3. The invention of claim 1, further comprising:
   a fourth capacitor and a fifth capacitor connected in series at a third node, and a terminal of said fifth capacitor being connected to said input terminal and a terminal of said fourth capacitor being connected to said input node; and
   a fifth resistor connected between said third node and a third constant bias.

4. The invention of claim 3, further comprising a sixth resistor connected between said second node and a fourth constant bias.

5. The invention of claim 4, wherein at least five of said second resistor, said third resistor, said fifth resistor, said sixth resistor, said second capacitor, said first capacitor, said third capacitor and said fifth capacitor are programmable to corresponding desired values.

6. The invention of claim 5, wherein said input terminal comprises on inverting terminal of said operational amplifier.

7. The invention of claim 6, wherein said filter circuit is implemented to operate in a single ended mode, a non-inverting terminal of said operational amplifier is connected to a fifth constant bias.

8. The invention of claim 6, wherein said filter circuit is implemented to operate in a differential mode.

9. A system processing an external signal, said system comprising:
- a pre-processing circuit processing said external signal to generate an input signal;
- a filter circuit processing said input signal to provide a variable gain amplification (VGA), said filter circuit comprising:
- an operational amplifier having an input terminal and an output terminal;
- a first resistor and a second resistor connected in series at a first node, a second terminal of said second resistor being connected to said input terminal of said operational amplifier, said first resistor being coupled to receive said input signal at an input node;
- a first capacitor connected between said first node and a first constant bias;
- a second capacitor connected between said input terminal and said output terminal;
- a third resistor and a fourth resistor connected in series between said input terminal and said output terminal, said third resistor and said fourth resistor being connected at a second node; and
- a third capacitor connected between said second node and a second constant bias,
- wherein at least some of said first resistor, said second resistor, said third resistor, said fourth resistor, said second capacitor, said first capacitor, and said third capacitor are programmable to corresponding desired values to achieve said desired VGA,
- and wherein said input signal amplified by said VGA is provided as an amplified output signal at said output terminal.

10. The system of claim 9, wherein at least three of said second resistor, said third resistor, said second capacitor, said first capacitor, and said third capacitor are programmable to corresponding desired values.

11. The system of claim 9, further comprising:
- a fourth capacitor and a fifth capacitor connected in series of a third node, and a terminal of said fifth capacitor being connected to said input terminal and a terminal of said fourth capacitor being connected to said input node; and
- a fifth resistor connected between said third node and a third constant bias.

12. The system of claim 11, further comprising a sixth resistor connected between said second node and a fourth constant bias.

13. The system of claim 12, wherein at least five of said second resistor, said third resistor, said fifth resistor, said sixth resistor, said second capacitor, said first capacitor, said third capacitor and said fifth capacitor are programmable to corresponding desired values.

14. The system of claim 13, wherein said input terminal comprises an inverting terminal of said operational amplifier.

15. The system of claim 13, wherein said filter circuit is implemented to operate in a single ended mode, a non-inverting terminal of said operational amplifier is connected to a fifth constant bias.

16. The system of claim 14, wherein said filter circuit is implemented to operate in a differential mode.

17. The system of claim 9, wherein said pre-processing circuit comprises:
- a low noise amplifier amplifying said external signal to generate an amplified intermediate signal; and
- a mixer down-converting said amplified intermediate signal into said input signal with the frequency band of interest centered at a lower frequency than the carrier frequency of said external signal.

18. The system of claim 9, further comprising:
- an analog to digital converter (ADC) converting said amplified output signal to a plurality of digital samples; and
- a processing unit processing said plurality of digital samples.

* * * * *